United States Patent
Sunwoo et al.

(10) Patent No.: US 11,957,130 B2
(45) Date of Patent: Apr. 16, 2024

(54) ANTIBACTERIAL FLEXIBLE COVER WINDOW

(71) Applicant: UTI INC., Chungcheongnam-do (KR)

(72) Inventors: Kukhyun Sunwoo, Gyeonggi-do (KR); Tea Joo Ha, Chungcheongnam-do (KR); Jae Suk Oh, Gyeonggi-do (KR); Jung Cheol Noh, Jeollabuk-do (KR)

(73) Assignee: UTI INC. (KR)

( * ) Notice: Subject to any disclaimer, the term of this patent is extended or adjusted under 35 U.S.C. 154(b) by 425 days.

(21) Appl. No.: 17/466,544

(22) Filed: Sep. 3, 2021

(65) Prior Publication Data

US 2022/0079161 A1   Mar. 17, 2022

(30) Foreign Application Priority Data

Sep. 11, 2020   (KR) .................. 10-2020-0117137

(51) Int. Cl.
| | |
|---|---|
| *A01N 59/20* | (2006.01) |
| *A01N 25/12* | (2006.01) |
| *A01N 59/16* | (2006.01) |
| *C03C 17/00* | (2006.01) |
| *C03C 17/34* | (2006.01) |
| *H05K 5/03* | (2006.01) |

(52) U.S. Cl.
CPC ............. *A01N 59/20* (2013.01); *A01N 25/12* (2013.01); *A01N 59/16* (2013.01); *C03C 17/007* (2013.01); *C03C 17/3405* (2013.01); *H05K 5/03* (2013.01); *C03C 2217/78* (2013.01)

(58) Field of Classification Search
None
See application file for complete search history.

(56) References Cited

FOREIGN PATENT DOCUMENTS

| KR | 10-0931748 B1 | 12/2009 |
| KR | 10-2068729 B1 | 1/2020 |
| KR | 10-2020-0052643 A | 5/2020 |

*Primary Examiner* — Cheng Yuan Huang
(74) *Attorney, Agent, or Firm* — Mendelsohn Dunleavy, P.C.

(57) ABSTRACT

Disclosed is an antibacterial flexible cover window formed using an antibacterial coating composition containing antibacterial nanoparticles dispersed in a resin coating solution. In the antibacterial coating composition, 0.001 to 0.5 parts by weight of the antibacterial nanoparticles are dispersed in 100 parts by weight of the resin coating solution. The antibacterial flexible cover window includes an antibacterial layer that is formed by applying the antibacterial coating composition to a glass substrate. Therefore, the antibacterial flexible cover window exhibits a good and long-lasting antibacterial activity.

17 Claims, 4 Drawing Sheets control

2nm, 0.01%

2nm, 0.05%

2nm, 0.1%

ANTIBACTERIAL FLEXIBLE COVER WINDOW

CROSS REFERENCE TO RELATED APPLICATION

The present application claims priority to Korean Patent Application No. 10-2020-0117137, filed Sep. 11, 2020, the entire contents of which is incorporated herein for all purposes by this reference.

BACKGROUND OF THE INVENTION

1. Field of the Invention

The present disclosure relates to a flexible cover window and, more particularly, to an antibacterial flexible cover window having good and long-lasting antibacterial performance.

2. Description of the Related Art

The gradual development of industry has caused environmental pollution, resulting in the recent global climate change. As a result, at present, diseases caused by new viruses, parasites, and bacteria are increasing. For the reason, research on antibacterial products is being actively conducted around the world.

A simple method of imparting antibacterial properties to a target object includes coating an antibacterial material on the surface of the target object or attaching an antibacterial film to the surface of the target object.

Silver (Ag) and copper (Cu) nanoparticles are the most used antibacterial materials. There are various products coated with silver or copper nanoparticles. However, there is a problem in that the nanoparticles coated on the products easily peel off with time, thereby not being able to perform an antibacterial property after a certain period of time.

Therefore, recently, antibacterial films have been widely used since they are conveniently applied on various products.

Specifically, these antibacterial films are coated on or attached to elevator operation buttons used by many people, touch panels of various electronic devices, and operation buttons of various products.

However, since existing antibacterial films are such that an antibacterial material is simply provided in the form of a coating on the surface of a substrate, there remains a problem in that the antibacterial material peels off over time.

In addition, when such an antibacterial film is coated on the surface of a product, the film also plays a role of protecting the surface of the product to some extent. However, since the antibacterial film itself is gradually damaged over time, the film cannot permanently protect the product, and the antibacterial performance gradually decreases over time.

On the other hand, in the case of a portable information communication terminal device such as a smart phone, operations for inputting and outputting various kinds of information are implemented through a display panel. That is, information can be input into and obtained from the device by touching the display panel. Therefore, the display panels of such devices are covered by a protective cover window, and the cover windows are usually formed from a polymer film or glass.

Recently, with active research on flexible displays, research for improving strength and folding characteristics of cover windows applicable to the flexible displays is also being actively conducted. Many studies have been conducted on glass-based cover windows having improved touch and strength characteristics as well as having improved folding characteristics.

However, most of the researchers developing improved cover windows have focused on improving strength and folding characteristics of the cover windows, but no attention has paid attention to imparting antibacterial properties to cover windows.

Specifically, in the case where a cover window is applied to a smartphone, many harmful bacteria stick to the surface of the cover window because the cover window is frequently operated by hands and is continuously exposed to various kinds of droplets and viruses or bacteria. Therefore, the surface of the cover window on the smartphone is a suitable habitat for growth of harmful bacteria.

Accordingly, there is demand for a cover window having a long-lasting antibacterial property and improved strength and folding characteristics and being capable of protecting an underlying display panel.

SUMMARY OF THE INVENTION

The objective of the present disclosure is to provide a flexible cover window including an antibacterial layer formed on a glass substrate and thus having a long-lasting good antibacterial property.

To achieve the above objective, the present disclosure provides a glass-based flexible cover window including: a planar portion formed to correspond to a planar region of a flexible display; and a folding portion extending from the planar portion and formed to correspond to a curved region of the flexible display. The cover window includes a glass substrate and an antibacterial layer formed on a front surface of the glass substrate. The antibacterial layer is formed by coating the front surface of the glass substrate with an antibacterial coating composition containing 0.001 to 0.5 parts by weight of antibacterial nanoparticles dispersed in 100 parts by weight of a resin coating solution.

The antibacterial nanoparticles may be nanoparticles of one material or a mixture of two or more materials selected from among silver, platinum, copper, and titanium dioxide and may have particle sizes ranging from 0.01 nm to 30 nm.

In addition, the resin coating solution may be optical clear resin (OCR). Specifically, the resin coating solution may be preferably one material selected from among acrylic compounds, epoxy, silicone, urethane, urethane compounds, urethane acrylic compounds, hybrid sol-gel, and siloxane-based resin.

In addition, the antibacterial layer may have a pencil hardness in a range of 3H to 9H.

In addition, the antibacterial layer may have a thickness in a range of 2 to 20 μm.

In addition, the antibacterial flexible cover window may include: a glass substrate; a primer layer formed on a front surface of the glass substrate or formed to surround the glass substrate; and an antibacterial layer formed on the primer layer formed on the front surface of the glass substrate, and the primer layer may have a thickness in a range of 0.1 to 10 μm.

In addition, the antibacterial flexible cover window may further include a shock-absorbing buffer layer formed under the primer layer formed on a back surface of the glass substrate, and the shock-absorbing buffer layer may have a thickness in a range of 1 to 60 μm.

In addition, the antibacterial flexible cover window may further include an internal buffer layer formed under the shock-absorbing buffer layer, and the internal buffer layer preferably has a thickness in a range of 1 to 40 μm.

Here, the planar portion and the folding portion may be integrally formed as a one-piece member, and the folding portion may be preferably thinner than the planar portion.

In addition, it is preferable that the folding portion is segmented into a plurality of regions.

According to the present disclosure, an antibacterial coating composition containing antibacterial nanonanoparticles dispersed in a resin coating solution is applied on a glass substrate to form an antibacterial layer. Therefore, it is possible to prepare a flexible cover window having a good and long-lasting antibacterial property.

In addition, the flexible cover window according to the present disclosure is formed by applying the antibacterial coating composition on a glass substrate and has high strength with a pencil hardness of 3H to 9H. Therefore, the flexible cover window according to the present disclosure is expected to be practically used due to the ability to exhibit an antibacterial effect and the ability to protect the surface of a flexible display.

BRIEF DESCRIPTION OF THE DRAWINGS

The above and other objectives, features, and other advantages of the present invention will be more clearly understood from the following detailed description taken in conjunction with the accompanying drawings, in which.

DESCRIPTION OF THE PREFERRED EMBODIMENTS

The present disclosure relates to a flexible cover window and, more particularly, to a flexible cover window obtained by forming an antibacterial layer on a glass substrate, the flexible cover window having good and long-lasting antibacterial performance.

In addition, the antibacterial layer is formed by coating a glass substrate with an antibacterial coating composition including a resin coating solution and antibacterial nanoparticles dispersed in the resin coating solution. The antibacterial layer exhibits an antibacterial effect and has good strength and folding characteristics.

Figure 6:
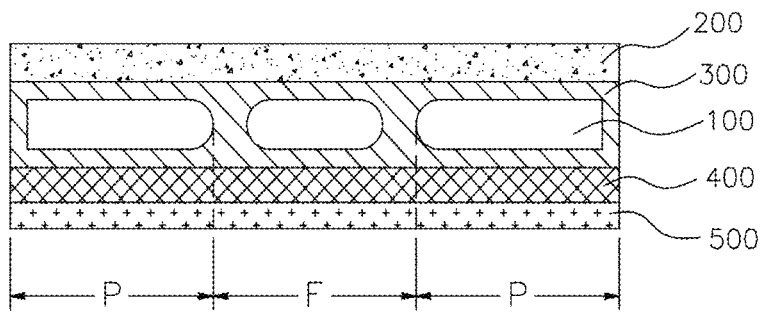
FIG. 6 shows photographs illustrating the antibacterial test results for an antibacterial flexible cover window according to one embodiment of the present disclosure.
Figure 7:
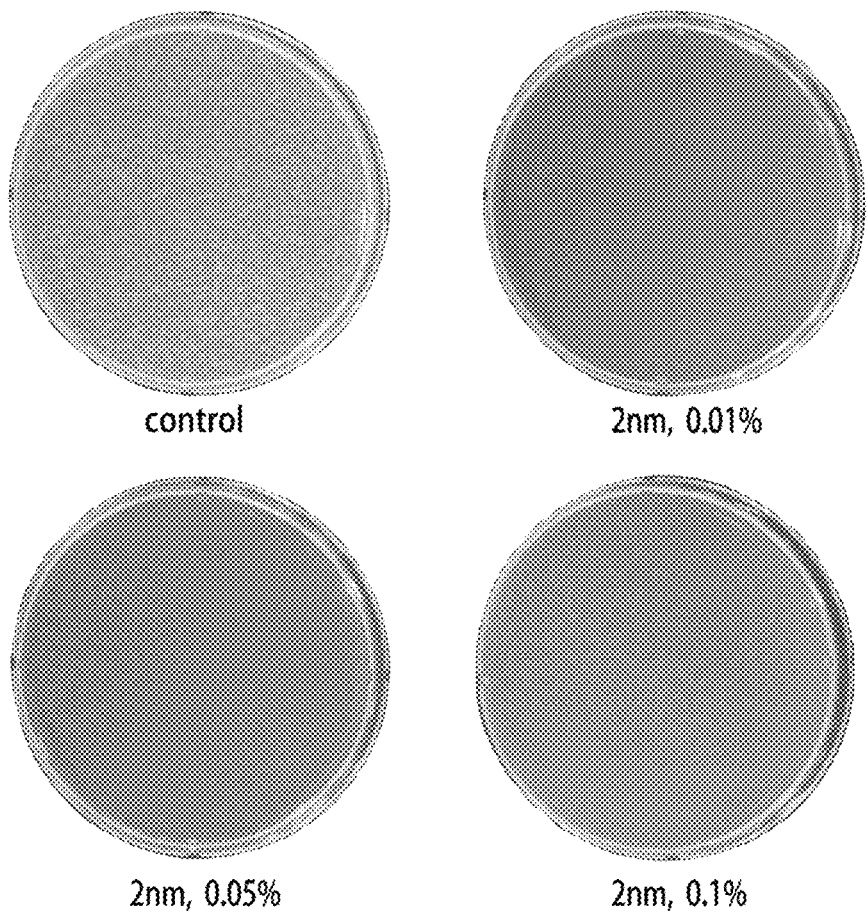
FIG. 7 shows photographs illustrating the antibacterial flexible cover window according to the embodiment of FIG. 6.

Herein below, exemplary embodiments of the present disclosure will be described in detail with reference to the accompanying drawings. FIGS. 1 to 5 are schematic diagrams illustrating flexible cover windows with improved strength, according to various embodiments of the present disclosure. FIG. 6 shows photographs illustrating antibacterial test results for an antibacterial flexible cover windows according to one embodiment of the present disclosure. FIG. 7 shows photographs of the antibacterial flexible cover window according to the embodiment of FIG. 6.

Referring to the drawings, a flexible cover window with improved strength, according to the present disclosure, is a glass-based flexible cover window and includes a planar portion P corresponding to a planar region of a flexible display and a folding portion F extending from the planar portion P and corresponding to a curved region of the flexible display. The flexible cover window further includes an antibacterial layer 200 formed on the front surface of the glass substrate 100.

In the present disclosure, the term "front surface" means a surface with which a user's finger, stylus pen, or the like comes into touch for operation of the device, and an upper-side surface in the drawings corresponds to the front surface. In the present disclosure, the term "back surface" means a surface opposite to the front surface, means a surface that is not touched by a user's finger, stylus pen, or the like, and means a surface facing the display panel. The lower-side surface in the drawings corresponds to the back surface.

In the present disclosure, the term "curved region" of a display panel refers to a region that is bent or curved so that the display panel can be folded. To correspond to the curved region of the display panel, the cover window has a folding portion F conforming to the curved region of the display panel. The remaining portion of the cover window, other than the folding portion F, is referred to as the planar portion P.

The base material of the flexible cover window of the present disclosure is glass. The glass substrate 100 is entirely planar (i.e., the thickness of the folding portion F and the planar portion P are the same), or the folding portion F is segmented into one or more regions. That is, the glass substrate 100 may be formed as a two-piece substrate, a three-piece substrate, or the like.

In addition, the folding portion F may be formed by slimming a base plate (i.e., glass substrate) so that the folding portion F may have a smaller thickness than the planar portion P. The thickness of the planar portion P of the cover window is about 50 to 300 μm, and the thickness of the folding portion F is about 10 to 100 μm. The folding portion F is formed by processing a very thin glass plate.

Here, the folding portion F may have a uniform thickness, or may be formed to have a thickness gradually increasing from the center of the folding portion toward either end portion thereof. That is, the folding portion F may be straight or curved.

When the folding portion F is formed in a straight shape, folding characteristics are improved compared to the case where the folding portion F is formed in a curved shape. When the folding portion F has a curved shape, since the area of a relatively thin region is small, the folding characteristics in a relatively thick region are deteriorated with repeated folding operations so that the relatively thick region may be easily broken. However, when the folding portion F has a uniform thickness, that is, when the folding portion F is formed in a straight shape with the same thickness over the entire region, the area of a relatively thin region is large, flexibility, restorability, and elasticity are improved, resulting in improved folding characteristics.

In addition, it is not easy to align the center of the curved folding portion F when joining the cover window with a target product. However, according to the present disclosure, since the folding portion F has a uniform thickness, it is possible to reduce an assembly error when attaching the cover window to a target product, thereby minimizing the quality variation among the finished target products and reducing the defect rate of the target products.

As described above, the straight folding portion F is advantageous over the curved folding portion F. However, the straight folding portion F and the curved folding portion F may be selectively used depending on the specifications of the target products.

Here, the width of the folding portion F is designed in consideration of the radius of curvature of the folding portion F when the cover window is folded, and it may be set to be the product of the radius of curvature and n. The thickness of the folding portion F of the cover window is set to be in a range of 10 to 100 μm, and the thickness is related to the folding characteristics of the folding portion F.

When the depth of the folding portion F is excessively deep, that is, when the folding portion of the cover window is excessively thin, the folding characteristics are improved but wrinkles are generated, ad strength is reduced. On the contrary, when the folding portion F is excessively thick, flexibility, restorability, and elasticity are reduced, resulting in deterioration in folding characteristics. Therefore, the thickness of the folding portion F is preferably set to be in a range of about 10 to 100 μm.

The cover window according to the present disclosure is formed using a glass substrate with a thickness of about 50 to 300 μm as a base material. The cover window is obtained by chemically strengthening the base material. Using the glass substrate having such a thickness range, the width and depth of the folding portion F are appropriately designed as described above. When the thickness of the base material is smaller than the lower limit of the thickness range, the thickness of the finished folding portion of the cover window becomes excessively thin, resulting in the problem described above. On the contrary, the thickness larger than the upper limit of the thickness range reduces the flexibility, restorability, and elasticity of the cover window and inhibits the weight reduction of a target display product.

In one embodiment of the present disclosure, the folding portion F is formed in the form of an inwardly recessed shape in the folding area of the cover window. That is, the folding portion F is in the form of an overall rectangular trench. Both sides of the folding portion F are inclined so that the surface of the cover windows is not stepped at the boundary between the folding portion F and the planar portion.

That is, the inclined portion with a low inclination angle formed at each end of the folding portion F (i.e., at the boundary between the planar portion P and the folding portion F) provides a moderate change in reflection angle over the surface of the cover window, thereby minimizing interference between reflected light rays and minimizing deterioration in visibility at the boundary between the folding portion and the planar portion.

In addition, etching patterns may be formed on the surface of the folding portion F and the surface of the planar portion P or formed on the surface of the folding portion F to improve strength and folding characteristics of the glass substrate 100.

The flexible cover window of the present disclosure is formed on the front surface of a display panel in a manner to maintain the folding characteristics and strength, thereby being used to protect the display panel. Alternatively, it may be disposed on a clear polyimide (CPI) cover to protect the CPI cover.

As described above, the present disclosure provides a flexible cover window using a glass material as a base material, being in the form of a thin plate, and having a folding portion F with improved strength and folding characteristics so that the flexible cover window can be applied to a flexible display panel. The glass substrate 100 constituting the flexible cover window may be a one-piece product that is uniform in thickness over the entire area thereof. Alternatively, the glass substrate 100 may be composed of a planar portion P and a slimmed portion that is thinner than the planar portion P.

Alternatively, the folding portion F may be segmented into a plurality of regions. The entire region of the glass substrate 100 or the folding portion F may be provided with etching patterns.

Figure 1:
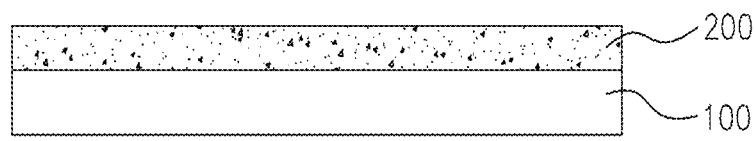
FIGS. 1 to 5 are schematic diagrams illustrating flexible cover windows with improved strength, according to various embodiments of the present disclosure.

Referring to FIG. 1, in one embodiment of the present disclosure, a flexible cover window with improved strength includes a glass substrate 100 and an antibacterial layer 200 formed on the front surface of the glass substrate 100.

When using a glass substrate as a base substrate of a flexible cover window, the thickness of the glass substrate must be less than or equal to a predetermined value to meet required folding characteristics, and the thickness must be greater than or equal to a predetermined value to meet required strength.

For example, when the radius of curvature must satisfy at least 0.5 mm or more when the cover window is folded, the thickness of the cover window must be 50 to 300 μm, preferably 200 μm or less, and more preferably 20 to 100 μm. In the case in which the thickness is within the range, when an object with a narrow cross-sectional area, such as a pen tip, drops to apply an impact to the upper surface (front surface) of the glass substrate 100, deformation and damage of the entire glass substrate 100 as well as the pen tip contact portion of the glass substrate 100 may occur.

Specifically, in the case of a cover window having a slimmed folding region, since the thickness of the slimmed portion is particularly thin, the cover window is vulnerable to an impact such as a pen drop. In addition, since there is a stress difference between the folding portion and the planar portion due to a thickness difference thereof, the glass substrate 100 may suffer a problem such as waveness. Due to these problems, such a cover window is very vulnerable to impact.

The fundamental characteristic of the present disclosure is to form the antibacterial layer 200 based on a resin composite on the front surface of the glass substrate 100 to improve the impact resistance so as to effectively endure a pen-drop impact in the folding portion F, to improve the folding characteristics and strength characteristics, and to impart antibacterial properties.

FIG. 1 is a diagram illustrating a structure in which the antibacterial layer 200 is formed on the front surface of the glass substrate 100. The antibacterial layer 200 is formed on the front surface (i.e., touch surface) of the cover window, thereby imparting long lasting antimicrobial properties to the cover window.

The antibacterial layer 200 is made from a resin composite antibacterial coating composition in which antibacterial nanoparticles are dispersed in a resin coating solution in a ratio of 0.001 to 0.5 parts by weight to 100 parts by weight. The antibacterial layer 200 is formed by coating the glass substrate 100 with the antibacterial coating composition.

The antibacterial nanoparticles have sizes of about 0.01 to 30 nm, and the antibacterial nanoparticles in an amount of 0.001 to 0.5 parts by weight are dispersed in the resin coating solution in an amount of 100 parts by weight. The antibacterial coating composition is transparent or translucent.

Here, the antibacterial layer 200 is coated on the glass substrate 100 through any one process among spraying, dip coating, bar coating, stamping, slot coating, etc.

The antibacterial layer 200 uses antibacterial nanoparticles to impart antibacterial properties to the cover window. The resin and the antibacterial nanoparticles are used together such that the antibacterial nanoparticles are coated in a state of being evenly dispersed and impregnated in the resin. Therefore, the uniform antibacterial performance can be obtained, and the peeling of the antibacterial nanoparticles can be prevented. In addition, the use of the resin has the effects of improving folding characteristics and effectively distributing an impact applied to the cover window.

In addition, since the antibacterial nanoparticles are coated in a state of being impregnated in the resin, the overall strength of the antibacterial layer 200 is improved. The antibacterial layer 200 according to the present disclosure has a pencil hardness in a range of 3H to 9H.

The antibacterial nanoparticles are preferably silver nanoparticles, platinum nanoparticles, copper nanoparticles, titanium dioxide nanoparticles, or a mixture thereof.

The silver nanoparticles, platinum nanoparticles, and titanium dioxide nanoparticles are excellent in antibacterial properties, and the copper nanoparticles are known to be excellent in removing bacteria. Any one kind of particles may be used solely. Alternatively, copper particles may be used in combination with any one kind of nanoparticles among silver particles, platinum nanoparticles, and titanium dioxide nanoparticles.

A conventional antibacterial film is formed by coating a base substrate with an antibacterial material such as copper particles. In this case, the joining of the base substrate and the antibacterial material is not satisfiable, and the antibacterial material is not uniformly coated on the base substrate. Therefore, the conventional antibacterial film is poor in the uniformity of antibacterial performance over the entire area thereof, and the antibacterial performance is deteriorated over time because the antibacterial material is oxidized.

In addition, when the conventional antibacterial film is applied to the surface of a flexible product, there is a problem in that waveness occurs in a folded portion of the product, or the antibacterial material falls off at around the folded portion.

In the case of the antibacterial coating composition according to the present disclosure, the antibacterial nanoparticles are coated on the glass substrate 100 in a state in which the antibacterial nanoparticles are uniformly dispersed in the resin coating solution. Therefore, the antibacterial layer exhibits uniform transparency, and the antibacterial nanoparticles are not exposed to the air. Therefore, the antibacterial nanoparticles are not oxidized so that the high antibacterial properties can last for a prolonged period of time.

Since the antibacterial nanoparticles are contained in an amount of 0.001 to 0.5 parts by weight with respect to 100 parts by weight of the resin coating solution, the antibacterial layer is transparent or translucent, and a state in which the antibacterial nanoparticles are evenly dispersed in the resin coating solution can be maintained. Therefore, a satisfiable antibacterial effect can be obtained with the use of a small number of antibacterial nanoparticles. Therefore, the cover window according to the present disclosure is cost effective.

In addition, the resin coating solution may be optical clear resin (OCR). Specifically, the resin coating solution may be anyone selected from among acrylic compounds, epoxy, silicone, urethane, urethane compounds, urethane acrylic compounds, hybrid sol-gel, and siloxane-based resin. These materials may be mixed in various combinations to control strength and elasticity.

The flexible cover window including the antibacterial layer 200, according to the present disclosure, has a pencil hardness in a range of 3H to 9H.

In general, a coating layer formed using a resin is known to have a pencil hardness in a range of 1H to 2H. However, according to the present disclosure, since a vertical composite antibacterial layer 200 is used, a hardness in a range of 3H to 9H can be obtained. Therefore, the cover window of the present disclosure functions to protect the surface of a product due to the increased hardness as well as exhibits an antibacterial effect.

In particular, the antibacterial layer 200 according to the present disclosure is formed by coating the glass substrate 100 with an antibacterial coating composition in which antibacterial nanoparticles are evenly dispersed in a resin coating solution. Therefore, even when the glass substrate 100 is folded or bent, the antibacterial layer 200 may not be cracked or broken. Therefore, the antibacterial layer 200 can be usefully applied to recent wearable electronic products and flexible displays.

Since the antibacterial layer exhibits an excellent antibacterial property, strength, and folding characteristics, it can be used as a cover window for a display panel or as a cover window for various operation buttons of electronic products. The antibacterial layer also can be used as a cover window for products requiring antibacterial property or products with a curved surface.

In an embodiment of the present disclosure, a flexible cover window may be formed by coating a glass substrate a thickness of about 150 μm with an antibacterial layer 200 using copper nanoparticles. The antibacterial layer 200 has a thickness of about 10 μm.

In addition, the antibacterial layer 200 may be optionally provided with an anti-finger (AF) or anti-reflective (AR) function as needed. This function may be realized by using a resin having such a function or by forming various patterns on the functional coating layer.

Figure 2:
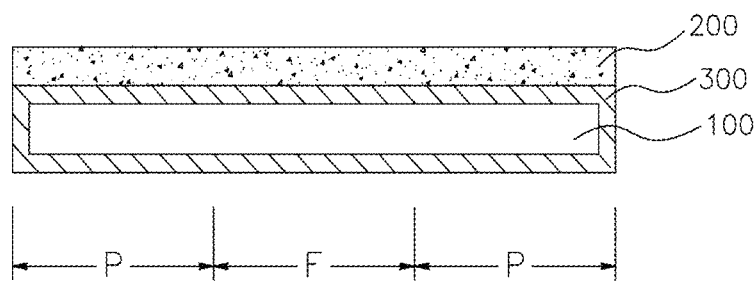

Referring to FIG. 2, in one embodiment of the present disclosure, an antibacterial flexible cover window includes a glass substrate 100, a primer layer 300 formed on the glass substrate 100, and an antibacterial layer 200 formed on the primer layer formed on the front surface of the glass substrate 100.

The primer layer 300 may be formed to wrap one surface or both surfaces (front and back) of the glass substrate 100 or to wrap the entire surface of the glass substrate 100. In the embodiment of FIG. 2, the primer layer 300 is formed to surround the entire surface of the glass substrate 100.

The primer layer 300 is formed on the glass substrate 100 to prevent scattering from the glass substrate 100 and to increase reliability in environmental resistance. The primer layer 300 has a thickness of about 0.1 to 10 μm.

Figure 3:
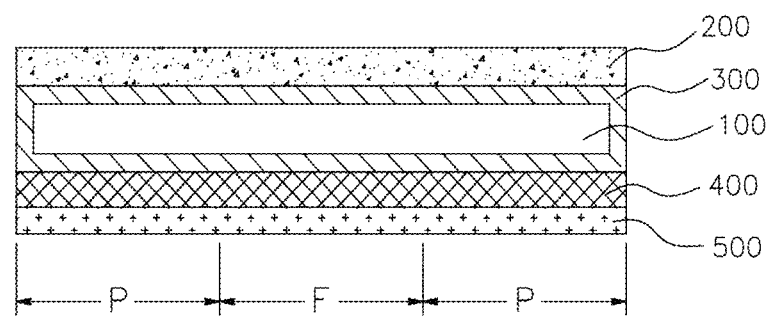

In another embodiment of the present invention, referring to FIG. 3, a shock-absorbing buffer layer 400 is formed under the primer layer 300 on the back side of the glass substrate 100, thereby absorbing a pen-drop impact applied to the back surface of the glass substrate 100.

In addition, the thickness of the shock-absorbing buffer layer 400 in the present disclosure may be in a range of 1 to 60 μm. This thickness is set to effectively absorb or distribute the impact force while satisfying the required overall thickness and folding characteristics of the flexible cover window.

When the thickness is smaller than the lower limit of the range, the effect of absorbing or distributing the impact force is insignificant. On the other hand, when the thickness is larger than the upper limit of the range, the folding characteristics may be deteriorated because the overall thickness of the flexible cover window is excessively thick.

An internal buffer layer 500 may be further formed under the shock-absorbing buffer layer 400. That is, the internal buffer layer 500 may be formed between the flexible display and the shock-absorbing buffer layer 400. The internal buffer layer 500 prevents scattering from the glass substrate 100 while increasing impact resistance. For the purposes, the thickness thereof is set to be in a range of 1 to 40 μm.

Figure 4:
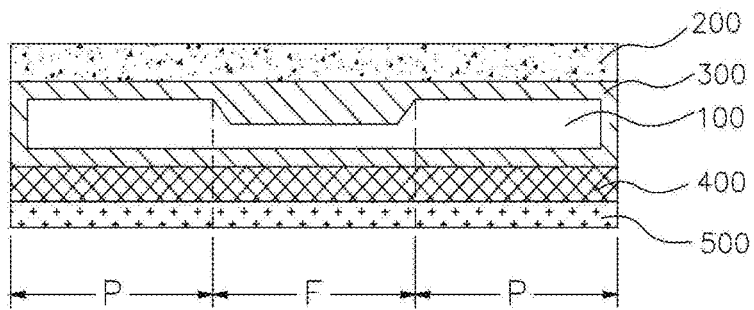

In a further embodiment of the present invention, as illustrated in FIG. 4, an antibacterial flexible cover window includes a glass substrate 100, an antibacterial layer 200 formed on the front side of the glass substrate 100, a primer layer 300 formed to surround all of the surfaces of the glass substrate 100, a shock-absorbing buffer layer 400 formed under the primer layer 300, an internal buffer layer 500 formed under the shock-absorbing buffer layer 400. That is, the shock-absorbing buffer layer 400 is formed on the back surface of the primary layer 300, and the internal buffer layer 500 is formed on the back surface of the shock-absorbing buffer layer 400. The glass substrate 100 has a planar portion P and a folding portion F that is slimmer than the planar portion P. This embodiment further improves not only the strength but also the folding characteristics of the cover window.

buffer layer 400. The glass substrate 100 has a planar portion P and a folding portion F that is segmented into two or more regions. That is, the glass substrate 100 is a three-piece member. This embodiment further improves not only the strength but also the folding characteristics of the cover window.

The primer layer 300, the shock-absorbing buffer layer 400, and the internal buffer layer 500 according to the present disclosure are formed using a transparent resin such as optical clear resin (OCR) having a refractive index of 1.5 that is almost equal to that of glass. The examples of such a resin include acrylic compounds, epoxy, silicone, urethane, urethane compounds, urethane acrylic compounds, hybrid sol-gel, and siloxane. These materials may be mixed in various combinations to control strength and elasticity.

Table 1 below shows an antibacterial test result for one embodiment of the present invention. In the embodiment, a 10 μm-thick antibacterial layer is formed on a about 150 μm-thick glass substrate using silver nanoparticles. In the test, change in antibacterial property according to the size and content of the silver nanoparticles was measured.

TABLE 1

| Size and content of silver nanoparticles | Antibacterial property | | *Staphylococcus aureus* | | Coli | | Bacteria reduction (%) | |
|---|---|---|---|---|---|---|---|---|
| | *Staphylococcus aureus* | Coli | Control | After test | Control | After test | *Staphylococcus aureus* | Coli |
| 2 nm, 0.01% | 4.8 | 5.9 | 1,500,000 | 24 | 22,000,000 | 28 | 99.998% | 99.99987% |
| 2 nm, 0.05% | 4.8 | 5.9 | 1,500,000 | 24 | 22,000,000 | 28 | 99.998% | 99.99987% |
| 2 nm, 0.1% | 4.8 | 5.9 | 1,500,000 | 24 | 22,000,000 | 35 | 99.998% | 99.99988% |
| 15 nm, 0.01% | 3.2 | 5.9 | 1,500,000 | 1000 | 22,000,000 | 35 | 99.93% | 99.99988% |
| 15 nm, 0.05% | 4.8 | 5.9 | 1,500,000 | 24 | 22,000,000 | 35 | 99.998% | 99.99988% |
| 15 nm, 0.1% | 4.8 | 5.9 | 1,500,000 | 24 | 22,000,000 | 35 | 99.998% | 99.99988% |

Figure 5:
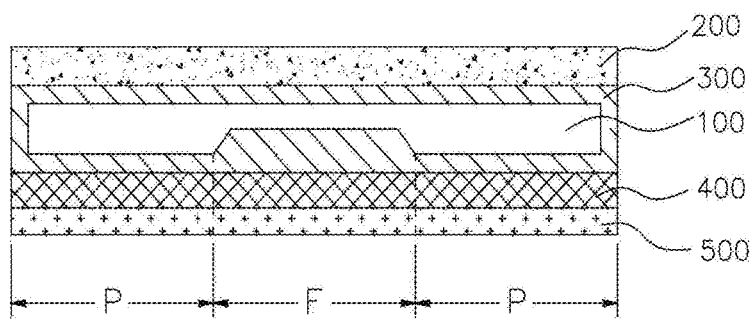

FIG. 4 illustrates an embodiment in which a slimmed folding portion faces forward, and FIG. 5 illustrates an embodiment in which a slimmed folding portion faces backward. The slimmed folding portion may be formed on the front side or the back side of the glass substrate 100, or on both sides of the glass substrate 100, depending on the specifications of an application target product.

In a yet further embodiment of the present disclosure, as illustrated in FIG. 6, an antibacterial flexible cover window includes a glass substrate 100, an antibacterial layer 200 formed on the front side of the glass substrate 100, a primer layer 300 formed to surround all of the surfaces of the glass substrate 100, a shock-absorbing buffer layer 400 formed under the primer layer 300, an internal buffer layer 500 formed under the shock-absorbing buffer layer 400. That is, the shock-absorbing buffer layer 400 is formed on the back surface of the primer layer 300, and the internal buffer layer 500 is formed on the back surface of the shock-absorbing As shown in Table 1, it was confirmed that there was almost no difference in an antimicrobial effect according to the size and content of silver nanoparticles. That is, an excellent antibacterial effect was exhibited in all examples.

FIG. 7 shows photographs showing test results for antibacterial performance exhibited in the examples of the present disclosure. The examples corresponding to the first, second, and third rows of Table 1 were tested. As shown in the drawing, it was confirmed that the antibacterial performance was particularly good.

Figure 8:
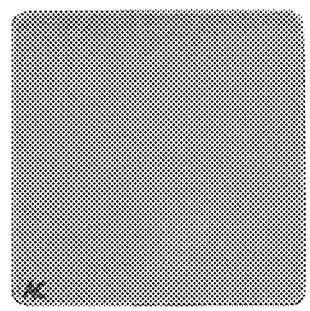
FIG. 8 shows photographs associated with the antibacterial flexible cover window according to the embodiment of FIG. 1.
Figure 8:
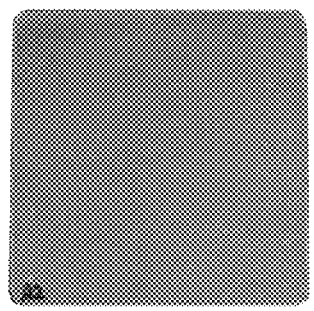
Figure 8:
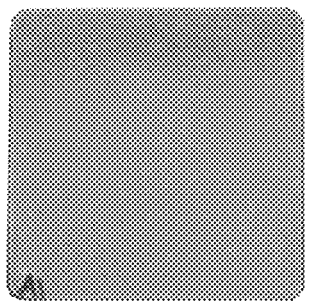
Figure 8:
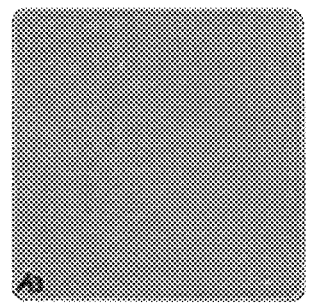

FIG. 8 shows photographs associated with the antibacterial flexible cover window according to the embodiment of FIG. 1. It was confirmed that the antibacterial layer was reliably formed on the glass substrate.

Table 2 shows antibacterial test results for one example of the present disclosure, Comparative Example 1 (in the case of a substrate without an antibacterial layer), and Comparative Example 2 (a commercially available copper antibacterial film).

TABLE 2

| Classification | Antibacterial property | | Staphylococcus aureus | | Coli | | Bacteria reduction (%) | |
|---|---|---|---|---|---|---|---|---|
| | Staphylococcus aureus | Coli | Control | After test | Control | After test | Staphylococcus aureus | Coli |
| Comparative Exmaple 1 | 0.6 | 4.3 | 1,500,000 | 410,000 | 22,000,000 | 1,000 | 72.7% | 99.9955% |
| Invention Exmaple | 4.8 | 5.9 | 1500000 | 24 | 22,000,000 | 28 | 99.998% | 99.99987% |
| Comparative Exmaple 2 | 3.0 | 5.1 | 260,000 | 260 | 28,000,000 | 220 | 99.9% | 99.9992% |

As shown in Table 2, it was confirmed that the antibacterial performance was very good. In addition, a change in antimicrobial performance was measured over time, and it was confirmed that there was only minor change in the antibacterial performance.

In addition, the example of the present disclosure exhibited a pencil hardness of 7H. With this hardness, when the antibacterial layer is applied to a touch panel or an operation button of an electronic device, it is possible to physically protect the surface of the touch panel or the operation button due to the improved strength as well as can exhibit a good antibacterial effect. In addition, it can well a cover window of a flexible display well because it has good folding characteristics.

Even when copper nanoparticles were used in another embodiment of the present disclosure, antibacterial performance was good and sufficiently long lasted. In addition, this case also exhibited high strength and good folding characteristics.

As described above, the objective of the present disclosure is to provide a flexible cover window that is formed by forming an antibacterial layer on a glass substrate and which has long-lasting good antibacterial performance.

In addition, the antibacterial layer is formed by applying an antibacterial coating composition, on a glass substrate, including a resin coating solution and antibacterial nanoparticles dispersed in the resin coating solution. Therefore, the antibacterial layer exhibits satisfiable antibacterial performance, strength, and folding characteristics.

What is claimed is:

1. A glass-based flexible cover window including a planar portion formed to correspond to a planar region of a flexible display panel and a folding portion formed to correspond to a folding region of the flexible display panel, the cover window comprising:
    a glass substrate; and
    an antibacterial layer formed on a front surface of the glass substrate,
    wherein the antibacterial layer is formed by coating the front surface of the glass substrate with an antibacterial coating composition containing 0.001 to 0.5 parts by weight of antibacterial nanoparticles with respect to 100 parts by weight of a resin coating solution, the antibacterial nanoparticles being dispersed in the resin coating solution.

2. The antibacterial flexible cover window according to claim 1, wherein the antibacterial nanoparticles are silver nanoparticles, platinum nanoparticles, copper nanoparticles, titanium dioxide nanoparticles, or any combination of two or more kinds thereof.

3. The antibacterial flexible cover window according to claim 1, wherein the antibacterial nanoparticles have sizes of 0.01 to 30 nm.

4. The antibacterial flexible cover window according to claim 1, wherein the resin coating solution is an optical clear resin (OCR) solution.

5. The antibacterial flexible cover window according to claim 3, wherein the resin coating solution uses one material selected from among acrylic compounds, epoxy, silicone, urethane, urethane compounds, urethane acrylic compounds, hybrid sol-gel, and siloxane-based resin.

6. The antibacterial flexible cover window according to claim 1, wherein the antibacterial layer has a pencil hardness in a range of 3H to 9H.

7. The antibacterial flexible cover window according to claim 1, wherein the antibacterial layer has a thickness of 2 to 20 μm.

8. The antibacterial flexible cover window according to claim 1, comprising:
    a glass substrate; and
    a primer layer formed on the glass substrate; and
    an antibacterial layer formed on the primer layer formed on a front surface of the glass substrate.

9. The antibacterial flexible cover window according to claim 8, wherein the primer layer is formed to surround the glass substrate.

10. The antibacterial flexible cover window according to claim 8, wherein the primer layer has a thickness of 0.1 to 10 μm.

11. The antibacterial flexible cover window according to claim 8, further comprising:
    a shock-absorbing buffer layer formed under the primer layer formed on a back surface of the glass substrate.

12. The antibacterial flexible cover window according to claim 11, wherein the shock-absorbing buffer layer has a thickness of 1 to 60 μm.

13. The antibacterial flexible cover window according to claim 11, further comprising:
    an internal buffer layer formed under the shock-absorbing buffer layer.

14. The antibacterial flexible cover window according to claim 13, wherein the internal buffer layer has a thickness of 1 to 40 μm.

15. The antibacterial flexible cover window according to claim 1, wherein the glass substrate is a one-piece member.

16. The antibacterial flexible cover window according to claim 15, wherein the glass substrate is formed such that the folding portion is slimmer than the planar portion.

17. The antibacterial flexible cover window according to claim 1, wherein the folding portion is composed of one region or is segmented into two or more regions.

* * * * *